(12) United States Patent
Elgaard et al.

(10) Patent No.: US 9,473,151 B1
(45) Date of Patent: Oct. 18, 2016

(54) LOW-NOISE OSCILLATOR AMPLITUDE REGULATOR

(71) Applicant: Telefonaktiebolaget L M Ericsson (publ), Stockholm (SE)

(72) Inventors: Christian Elgaard, Lund (SE); Lars Sundström, Södra Sandby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/731,487

(22) Filed: Jun. 5, 2015

(51) Int. Cl.
*H03L 5/00* (2006.01)

(52) U.S. Cl.
CPC ..................... *H03L 5/00* (2013.01)

(58) Field of Classification Search
CPC ...... H03B 2201/031; H03L 5/00; H03L 5/02
USPC .................. 331/15, 109, 182, 183
See application file for complete search history.

(56) References Cited

U.S. PATENT DOCUMENTS

| 4,166,981 | A | | 9/1979 | Marchasson et al. | |
|---|---|---|---|---|---|
| 6,064,277 | A | * | 5/2000 | Gilbert | H03L 5/00 331/109 |
| 7,026,883 | B2 | * | 4/2006 | Muthali | H03B 5/04 331/109 |
| 7,098,753 | B1 | | 8/2006 | Dumitrescu et al. | |
| 7,123,113 | B1 | * | 10/2006 | Brennan | H03L 5/00 331/116 FE |
| 7,289,003 | B2 | * | 10/2007 | Blum | H03B 5/1228 331/117 FE |
| 7,324,561 | B1 | | 1/2008 | Miller et al. | |
| 7,808,334 | B2 | * | 10/2010 | Yoshida | G01F 1/8422 310/329 |
| 7,902,933 | B1 | * | 3/2011 | Brennan | H03L 3/00 331/116 R |
| 7,999,628 | B2 | * | 8/2011 | Miyashita | H03B 5/1228 323/273 |
| 2005/0073371 | A1 | | 4/2005 | Brett et al. | |
| 2007/0030085 | A1 | | 2/2007 | Brennan et al. | |
| 2008/0266011 | A1 | * | 10/2008 | Kuosmanen | H03L 5/00 331/175 |
| 2009/0224836 | A1 | * | 9/2009 | Orberk | H03L 5/00 331/15 |
| 2014/0035684 | A1 | * | 2/2014 | Na | H03L 5/00 331/15 |

FOREIGN PATENT DOCUMENTS

EP 2482459 A1 1/2012

\* cited by examiner

*Primary Examiner* — Levi Gannon
(74) *Attorney, Agent, or Firm* — Coats & Bennett, PLLC (57) ABSTRACT

A frequency generation solution controls an oscillator amplitude using two feedback paths to generate high frequency signals with lower power consumption and lower noise. A first feedback path provides continuous control of the oscillator amplitude responsive to an amplitude detected at the oscillator output. A second feedback path provides discrete control of the amplitude regulating parameter(s) of the oscillator responsive to the detected oscillator amplitude. Because the second feedback path enables the adjustment of the amplitude regulating parameter(s), the second feedback path enables an amplifier in the first feedback path to operate at a reduced gain, and thus also at a reduced power and a reduced noise, without jeopardizing the performance of the oscillator.

21 Claims, 8 Drawing Sheets

LOW-NOISE OSCILLATOR AMPLITUDE REGULATOR

TECHNICAL FIELD

The solution presented herein relates generally to frequency generation, and more particularly to reducing phase noise and power consumption of high frequency generation circuits.

BACKGROUND

Oscillators are widely used in various electronic devices, e.g., to provide reference clocks, mixing frequencies for telecommunication signals, etc. A negative resistance-based oscillator represents one type of oscillator architecture typically used for the generation of higher frequency signals, such as used in wireless communication devices. Examples of negative resistance-based oscillators include, but are not limited to crystal oscillators, Surface Acoustic Wave (SAW)-based oscillators, etc. Negative resistance-based oscillators comprise an oscillator core having a resonant circuit operatively connected to a negative resistance circuit. The resonant circuit oscillates at the desired resonant frequency, and the negative resistance circuit cancels the resistive losses of the resonant circuit. In effect, the negative resistance circuit eliminates the natural damping of the resonant circuit, and therefore enables the oscillator core to continuously oscillate at the desired resonant frequency.

The successful operation of electronic devices containing such oscillators requires accurate and reliable amplitude control. In particular, amplitude control is necessary due to the fact that different Q-values, e.g., of different resonant circuits, as well as different PVT (Process, Voltage, and Temperature) conditions for any one oscillator may cause wide amplitude variations. For example, an oscillator having a high-Q resonant circuit will have higher amplitude oscillation than an oscillator having a low-Q resonant circuit. Further, an oscillator running in a linear mode requires continuous regulation of the amplitude to prevent the oscillator amplitude from quickly falling to zero or increasing to a level limited by the non-linear effects, e.g., voltage clipping, of the oscillator. Such voltage clipping can greatly deteriorate oscillator performance, increase the risk of parasitic oscillation, increase the current consumption (depending on circuit topology), and generally make the behavior of the oscillator more unpredictable. Accurate and reliable amplitude control will equalize the amplitude variations across a wide range of Q-values and PVT conditions, as well as ensure good noise performance, provide low current consumption, avoid parasitic oscillation, and possibly prevent damage to active and passive components A negative feedback loop provides one way to control the amplitude of the oscillator output, where the negative feedback loop senses the amplitude of the oscillator output and then adjusts the amplitude by controlling an operating point of the oscillator core. For example, controlling the current through active transistor devices of the oscillator core controls the transconductance $g_m$ of the oscillator core to control the negative resistance, and thus controls the oscillator amplitude. However, such negative feedback loops may introduce noise into the oscillator core, particularly when the negative feedback loop has a high gain. Further, the non-linear properties of the oscillator core will convert the input noise to both AM (Amplitude Modulation) and PM (Phase Modulation) noise. While increasing the loop gain of the negative feedback loop will reduce the AM noise, such an increased loop gain will not only increase the power consumption, but will also fail to reduce the PM noise. While reducing the bandwidth of the negative feedback loop will also reduce the noise, such a bandwidth reduction, however, will increase the startup time of the oscillator, and may also undesirably increase the size (consumed chip area) of any filter required to filter the oscillator input signal. Thus, such bandwidth reduction is also not desirable.

As noted above, negative resistance-based oscillators are particularly useful for high frequency applications, and may be particularly important for mmW (millimeter wave) communication. Also, specifically for reference oscillators based on e.g., crystal or SAW resonators, the use of even higher frequencies is anticipated, from todays 10's of MHz to 100's of MHz and possibly even frequencies approaching the GHz range. The generation of such higher frequencies generally results in higher power consumption. Further, the generation of such higher frequencies also presents design challenges due to increased tolerances of the resonators, increased noise, increased component sizes, longer startup times, and/or larger impacts from parasitic elements of the circuitry and associated package. Thus, there remains a need for improved higher frequency generation circuits that do not incur higher power consumption, higher noise, and/or longer start-up times.

SUMMARY

The solution presented herein generates high frequency signals with lower power consumption and lower noise by controlling an oscillator amplitude using two feedback paths. A first feedback path provides continuous control of the oscillator amplitude responsive to an amplitude detected at the oscillator output. A second feedback path provides discrete control of the amplitude regulating parameter(s) of the oscillator responsive to the detected oscillator amplitude. Because the second feedback path enables the adjustment of the amplitude regulating parameter(s), the second feedback path enables an amplifier in the first feedback path to operate at a reduced gain, and thus also at a reduced power and a reduced noise, without jeopardizing the performance of the oscillator.

One exemplary embodiment comprises a frequency generation circuit comprising an oscillator, a detector, a first feedback path, and a second feedback path. The oscillator comprises an oscillator output, a first control input, and a second control input. The detector is configured to detect an amplitude of the oscillator output. The first feedback path operatively connects the detector to the first control input, and is configured to provide time-continuous control, responsive to the detected amplitude, of the amplitude of the oscillator output by continuously controlling a first control signal applied to the first control input. The second feedback path operatively connects the detector to the second control input, and is configured to provide time-discrete control, responsive to the detected amplitude, of one or more amplitude regulating parameters of the oscillator by providing time-discrete control of a second control signal applied to the second control input.

Another exemplary embodiment comprises a method of controlling an oscillator comprising an oscillator output, a first control input, and a second control input. The method comprises detecting an amplitude of the oscillator output, and providing time-continuous control, responsive to the detected amplitude, of the amplitude of the oscillator output by continuously controlling a first control signal applied to the first control input. The method further comprises providing time-discrete control, responsive to the detected amplitude, of one or more amplitude regulating parameters of the oscillator by providing time-discrete control of a second control signal applied to the second control input.

Another exemplary embodiment comprises a computer program product stored in a non-transitory computer readable medium for controlling an oscillator of a frequency generation circuit. The oscillator comprises an oscillator output, a first control input, and a second control input. The computer program product comprises software instructions which, when run on the frequency generation circuit, causes the frequency generation circuit to detect an amplitude of the oscillator output, and provide time-continuous control, responsive to the detected amplitude, of the amplitude of the oscillator output by continuously controlling a first control signal applied to the first control input. The software instructions, when run on the frequency generation circuit, further cause the frequency generation circuit to provide time-discrete control, responsive to the detected amplitude, of one or more amplitude regulating parameters of the oscillator by providing time-discrete control of a second control signal applied to the second control input.

DETAILED DESCRIPTION

Figure 1:
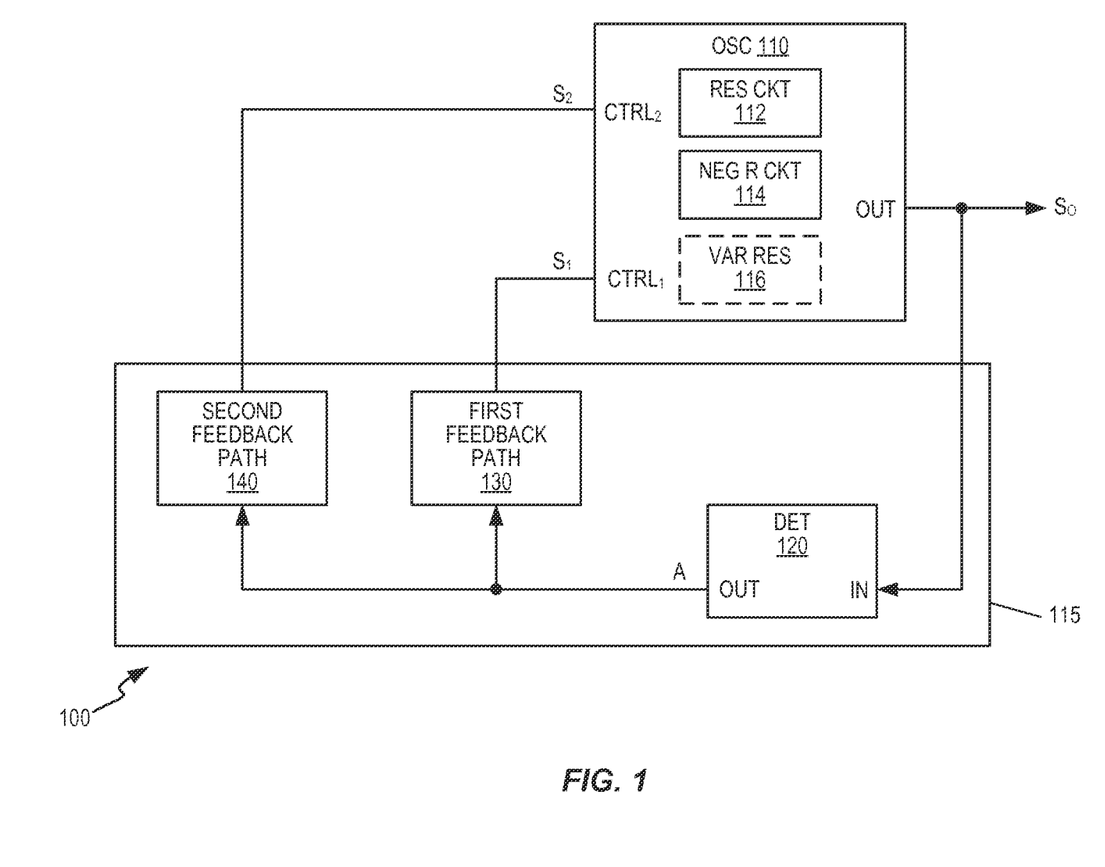
FIG. 1 shows a block diagram of a frequency generation circuit according to one exemplary embodiment.

FIG. 1 shows a block diagram of a frequency generation circuit 100 according to one exemplary embodiment. For simplicity, FIG. 1 only shows the elements of the frequency generation circuit 100 necessary to facilitate the description provided herein. It will be appreciated by those skilled in the art that the frequency generation circuit 100 may include additional components and/or signal connections not shown in FIG. 1.

Frequency generation circuit 100 includes an oscillator 110 coupled to control circuitry 115 that controls the amplitude of the oscillator output. Oscillator 110 includes a first control input ($CTRL_1$), a second control input ($CTRL_2$), and an output (OUT). The oscillator 110 may comprise a crystal oscillator, or any other negative resistance-based oscillator that includes a resonant circuit 112 operatively connected to a negative resistance circuit 114. In one exemplary embodiment, the resonant circuit 112 may comprise a crystal, and the negative resistance circuit 114 may comprise an amplifier (not shown). First and second control signals, $S_1$ and $S_2$, applied to the respective first and second control inputs control the amplitude of the signal $S_o$ at the output of the oscillator 110. In particular, the first control signal $S_1$ provides time-continuous control of the amplitude of $S_o$, while the second control signal $S_2$ provides time-discrete control of one or more amplitude regulating parameters of the oscillator 110, as described further below. Exemplary amplitude regulating parameters include, but are not limited to, an oscillator bias current, a number of active oscillator $g_m$ cells, a bias point of one or more of the oscillator $g_m$ cells, and/or a variable resistance connected in parallel with a core of the oscillator 110. Because the second control signal $S_2$ controls the configuration of the oscillator 110, $S_2$ enables the relaxation of the requirements that would otherwise be placed on the time-continuous amplitude control provided by the first control signal $S_1$.

Figure 2:
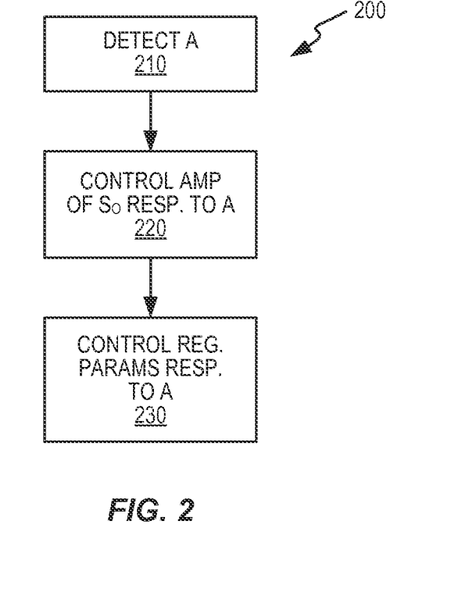
FIG. 2 shows an amplitude control method according to one exemplary embodiment.

The control circuitry 115 generates the first and second control signals $S_1$, $S_2$ responsive to the oscillator output signal $S_o$ according to the exemplary method 200 of FIG. 2. More particularly, the control circuitry 115 comprises a detector 120, a first feedback path 130, and a second feedback path 140. The detector 120, which is coupled between the oscillator output and the inputs of the first feedback path 130 and the second feedback path 140, detects an amplitude A of the oscillator output signal $S_o$ (block 210). The first feedback path 130 provides time-continuous control of the amplitude of the oscillator output signal $S_o$ by continuously controlling the first control signal $S_1$ responsive to the detected amplitude A (block 220). The second feedback path 140 provides time-discrete control of one or more amplitude regulating parameters of the oscillator 110 by controlling, in discrete time, the second control signal $S_2$ responsive to the detected amplitude A (block 230). For example, the second control signal may provide time-discrete control of the parameter(s) controlling the operation of the negative resistance circuit 114. By controlling the amplitude regulating parameter(s) of the oscillator 110, the second feedback path 140 allows the first feedback path 130 to operate at a lower gain, and therefore at a lower power and with less noise.

Figure 3:
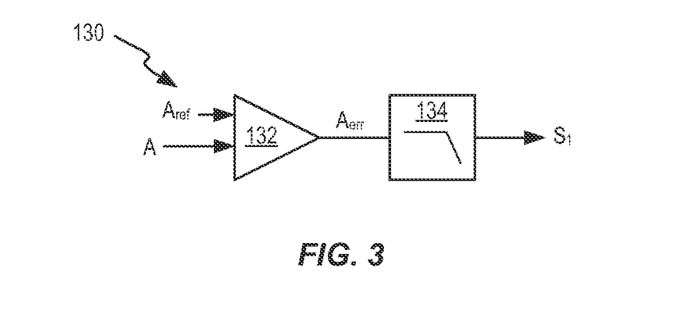
FIG. 3 shows a block diagram of the first feedback path of the frequency generation circuit of FIG. 1 according to one exemplary embodiment.

FIG. 3 shows a block diagram of the first feedback path 130 according to one exemplary embodiment. In this embodiment, the first feedback path 130 includes an amplifier 132 and a filter 134. The detected amplitude A, as well as a reference amplitude $A_{ref}$, are input to amplifier 132. Amplifier 132 amplifies the amplitude error $A_{err}$ formed from the difference between the detected amplitude A and the reference amplitude $A_{ref}$, and filter 134 helps reduce the noise input to the oscillator 110 by low-pass filtering the amplified signal to generate the first control signal $S_1$. The first control signal $S_1$ controls the gain of the oscillator core by controlling the gain of the negative resistance circuit 114. In so doing, the first control signal $S_1$ controls the amplitude of the oscillator output signal $S_o$.

Amplifier 132 establishes the gain of the first feedback path 130. Because various environmental conditions, oscillator properties, and/or the age of the oscillator 110, may impact the ability of the first control signal $S_1$ to sufficiently control the amplitude of the oscillator output signal $S_o$, conventional systems tend to set the gain of amplifier 132 to account for a wide range of conditions, even if some of the more extreme conditions are very rare. For example, higher temperatures may reduce the gain of the oscillator core relative to what that gain would be with the same input control signal at regular operating temperatures. Conventional solutions address this problem by making sure the gain of amplifier 132 is high enough to enable the oscillator core to handle even extreme temperature conditions without dropping the amplitude of the oscillator output $S_o$ below a desired level. Such high gain conditions, however, cause amplifier 132 to consume more power and to insert more noise into the oscillator core than would otherwise be necessary for many operating conditions.

The solution presented herein incorporates the second feedback path 140 into the control circuitry 115 to control the amplitude regulating parameter(s) of the oscillator 110, which allows the first feedback path 130 to be designed and configured for a lower gain. Such gain reduction in the first feedback path 130 will enable the frequency generation circuit 100 to operate at a lower power and will reduce the noise level input to oscillator 110. To that end, the second feedback path 140 controls one or more amplitude regulating parameters responsive to the detected amplitude A of the oscillator output signal $S_o$. For example, if the detected amplitude A drops too low, indicating that the first control signal is unable to sufficiently amplify the oscillator amplitude, the second feedback path 140 may adjust the amplitude regulating parameters, e.g., by increasing the bias current, increasing the number of active oscillator gm cells, and/or increasing a bias point of one or more of the active gm cells. Alternatively or additionally, the second feedback path 140 may adjust the amplitude regulating parameters by increasing the resistance of a variable resistance connected in parallel with the oscillator core, e.g., using a variable resistor 116 connected across differential outputs of the oscillator 110. In another example, if the detected amplitude A rises too high, indicating the amplitude of the oscillator output signal $S_o$ is too high, the second feedback path 140 may decrease the bias current, decrease the number of active oscillator gm cells, decrease a bias point of one or more of the active gm cells, and/or decrease the resistance of the variable resistor 116 connected in parallel with the core of the oscillator 110. In either case, the second feedback path 140 adjusts the amplitude regulating parameter(s) for the current operating conditions as indicated by the detected amplitude A to enable the oscillator 110 to maintain the desired amplitude at the output without requiring the first feedback path 130 to have a high gain.

Figure 4:
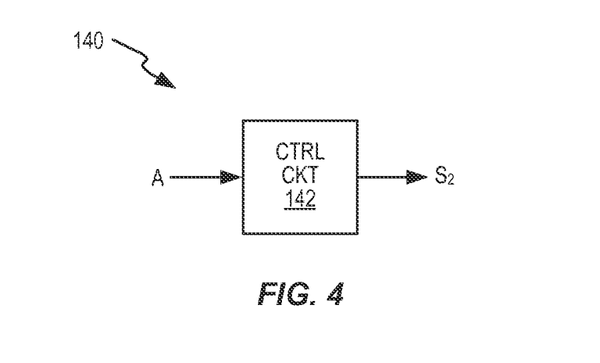
FIG. 4 shows a block diagram of the second feedback path of the frequency generation circuit of FIG. 1 according to one exemplary embodiment.

Because the gain of amplifier 132 is designed to handle most operating conditions, the control provided by the second feedback path 140 may be implemented in a time-discrete manner. For example, the second feedback path 140 may include a control circuit 142, as shown in FIG. 4. Control circuit 142 may control the amplitude regulating parameter(s) of the oscillator in a time-discrete manner by only controlling the amplitude regulating parameter(s) when the detected amplitude A satisfies one or more predetermined conditions, e.g., threshold conditions. For example, the control circuit 142 may control the second control signal $S_2$ to control the amplitude regulating parameter(s) only when the detected amplitude A exceeds an upper threshold $T_U$ or is lower than a lower threshold $T_L$. In addition, the control circuit 142 may control the second control signal $S_2$ to control the amplitude regulating parameter(s) only under certain operating conditions and/or responsive to an event trigger. For example, control circuit 142 may control the second control signal $S_2$ to allow the amplitude regulating parameter(s) to change when the oscillator 110 powers on and/or when the oscillator 110 is acting in response to some communication event trigger. However, because changing the amplitude regulating parameters during, e.g., active communications, could disrupt the phase and/or frequency of the oscillator 110, the control circuit 142 may control the second control signal $S_2$ to prevent the amplitude regulating parameter(s) from changing during such periods to prevent this disruption. The control circuit 142 may therefore use, in addition to the threshold conditions, power on/off events and/or communication event triggers to provide additional time-discrete control of the oscillator's amplitude regulating parameter(s).

Figure 5:
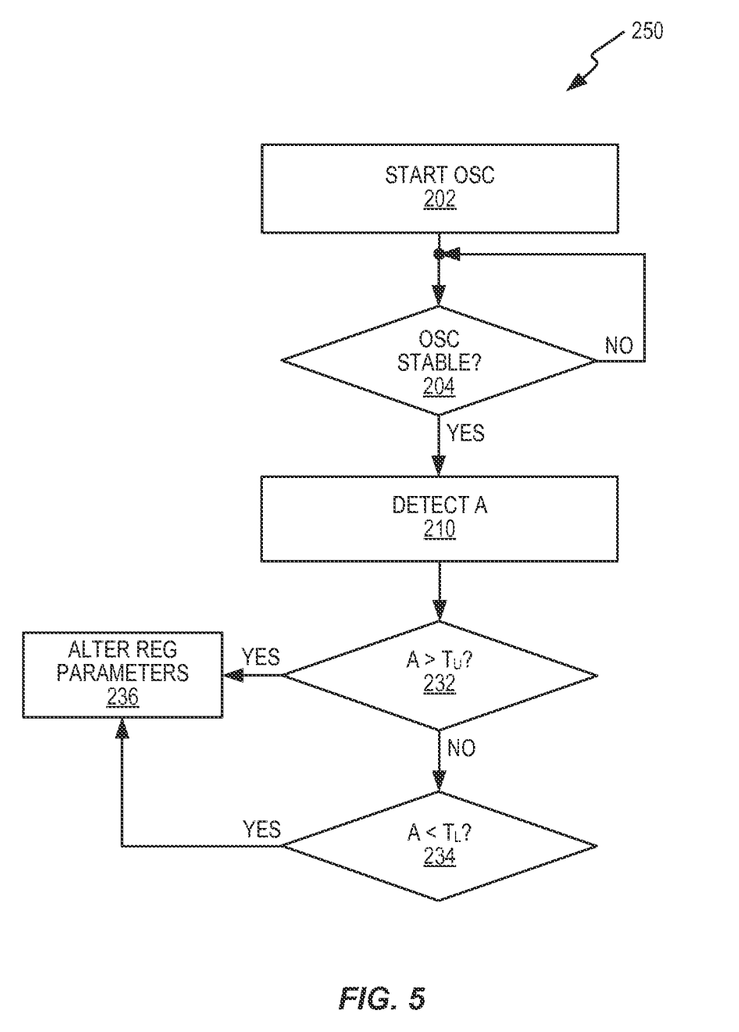
FIG. 5 shows another amplitude control method according to one exemplary embodiment.

The exemplary method 250 of FIG. 5 provides a more detailed approach for controlling the oscillator 110 at startup. In this exemplary method 250, the oscillator 110 is powered on (block 202), and the process waits until the oscillator 110 stabilizes (block 204). Once the oscillator 110 stabilizes (block 204), the detector 120 detects the amplitude A of the oscillator output signal $S_o$ (block 210). If the detected amplitude A exceeds an upper threshold $T_U$ (block 232) or is less than a lower threshold $T_L$ (block 234), the control circuit 142 in the second feedback path 140 determines the oscillator 110 is unable to maintain a desired amplitude with the current configuration. In response, the control circuit 142 therefore alters one or more amplitude regulating parameters of the oscillator 110 (block 236). Blocks 210, 232, and 234 may be repeated once the oscillator 110 stabilizes again (block 204). This repetition may be indefinite, or may terminate after some predetermined maximum number of iterations.

Figure 6:
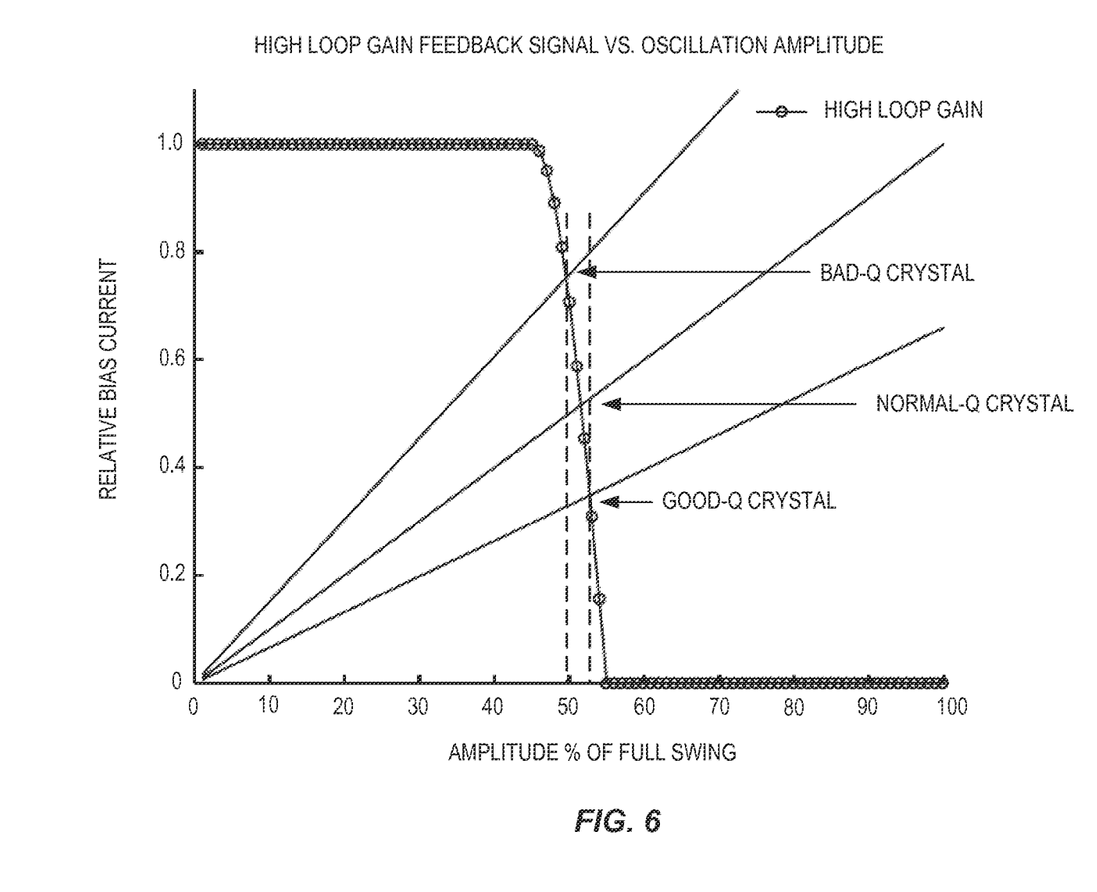
FIG. 6 shows simulation results achievable with only a first feedback path having a high gain.
Figure 7:
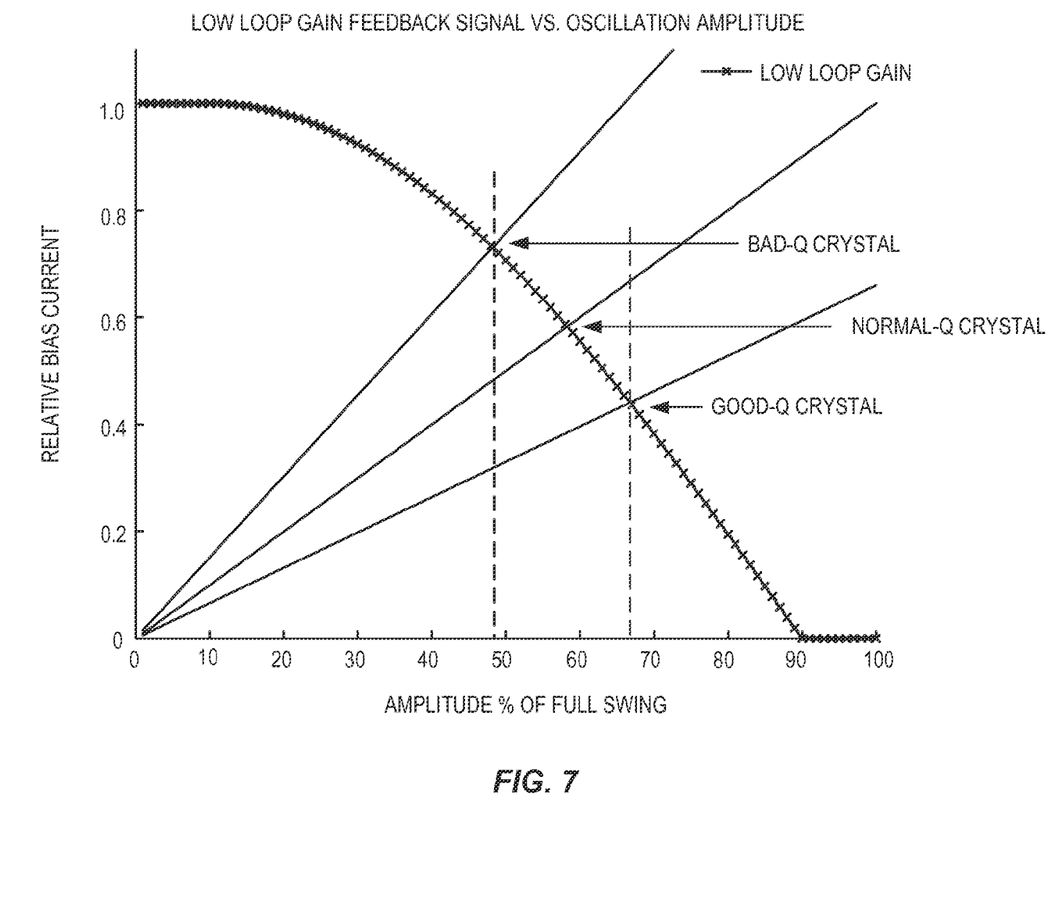
FIG. 7 shows simulation results achievable with only a first feedback path having a low gain.

FIGS. 6-10 show simulation results to demonstrate the advantages of the solution presented herein. FIGS. 6 and 7 first show the oscillation amplitude achievable when the control circuitry 115 does not include the second feedback path 140. In this case, the amplitude regulating parameters of the oscillator 110 are fixed and the first feedback path 130 provides the only amplitude control. FIG. 6 provides results when amplifier 132 in the first feedback path 130 is configured to operate with a high gain that results in a relatively high loop gain, e.g., greater than 10, versus the results in FIG. 7 where the amplifier 132 operates with a lower gain that results in a relatively low loop gain, e.g., less than 5. As shown by FIG. 6, the higher loop gain implementation provides a very low amplitude variation, e.g., 50-55% of the full swing. However, the high gain necessary to achieve this low amplitude variation results in high power consumption and high noise levels. The lower loop gain implementation enables lower power consumption and noise levels, but as shown in FIG. 7, this lower loop gain implementation has a relatively high amplitude variation, e.g., 48-68% of the full swing.

Figure 8:
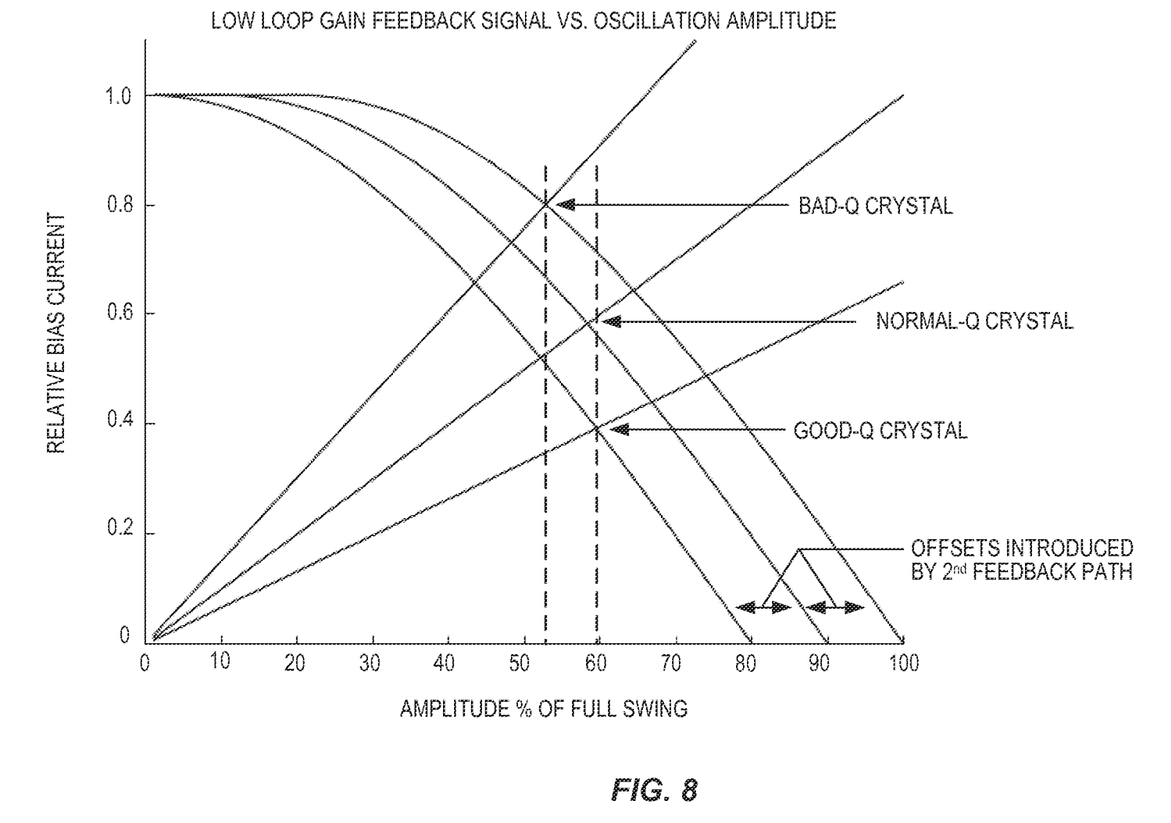
FIG. 8 shows exemplary simulation results achievable with the solution presented herein.

FIG. 8 shows the results when the second feedback path 140 is included with the control circuitry 115 to enable time-discrete adjustment of the amplitude regulating parameter(s) of the oscillator 110. In this simulation, the first feedback path 130 has a low gain and the second feedback path 140 is used to control two extra amplitude regulating parameters, e.g., the bias tail current and/or the number of $g_m$ cells in the oscillator core, as shown by the three curves in FIG. 8. As shown by FIG. 8, the solution presented herein results in a lower amplitude variation (52-60%), which was previously not achievable when the first feedback path 130 had a lower loop gain. Thus, the solution presented herein provides the lower noise and power consumption benefits more typically associated with lower loop gain implementations while also providing the amplitude control benefits more typically associated with higher loop gain implementations.

Figure 9:
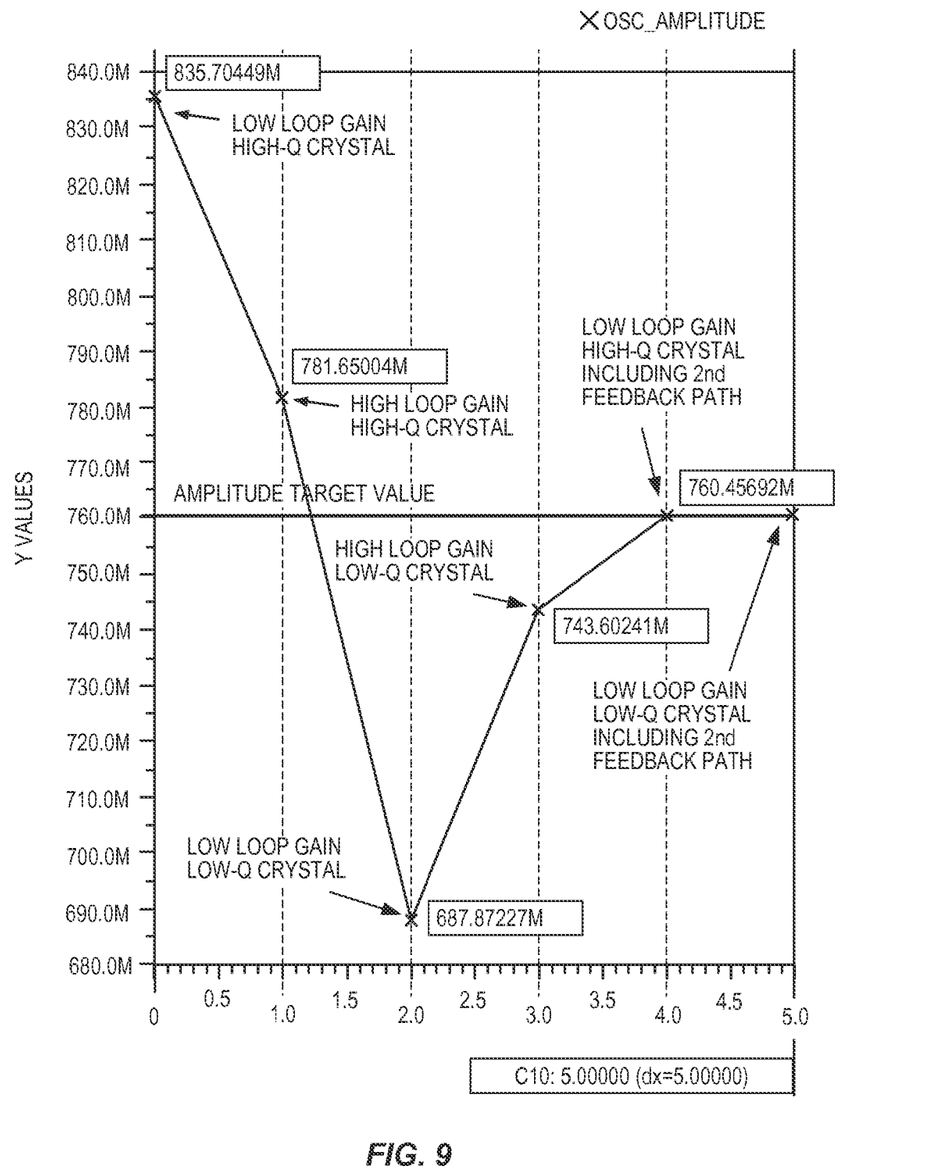
FIG. 9 shows exemplary simulation results when the first feedback path has different gains.

FIG. 9 shows simulation results demonstrating how the gain of amplifier 132 may be selected to achieve the desired trade-off between amplitude control and noise/power reduction. The results in FIG. 9 demonstrate the oscillator amplitude performance for six scenarios, which are qualitatively specified at each point, e.g., "high loop gain," "low loop gain including second feedback path," etc. The first four scenarios show the amplitude performance for high/low loop gain and high/low Q scenarios when the second feedback path 140 is not included. The last two scenarios show the amplitude performance for low loop gain and high/low Q scenarios when the second feedback path 140 is included.

Figure 10:
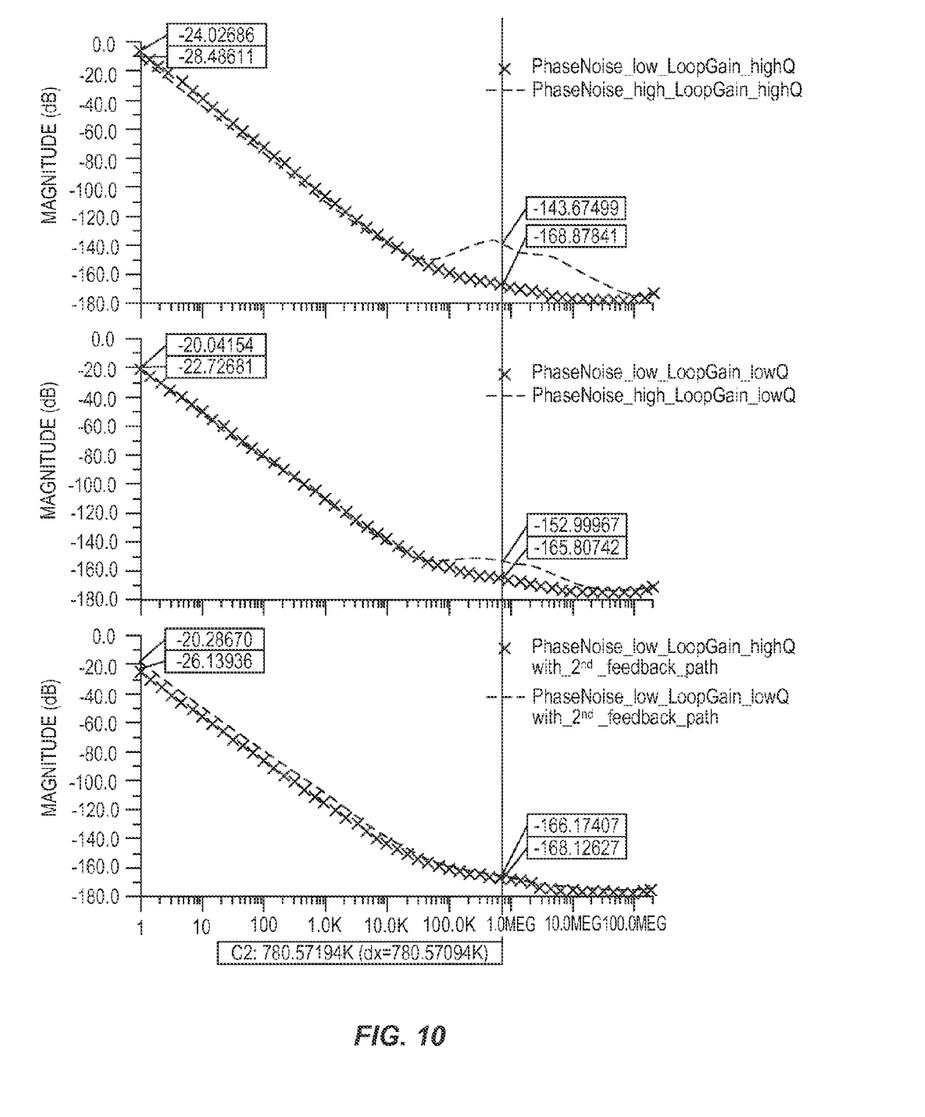
FIG. 10 shows exemplary simulation results of the noise improvement achievable with the solution presented herein.

FIG. 10 shows simulation results demonstrating the noise performance for the same six scenarios as in FIG. 9, and thus demonstrates the noise improvement provided by the solution presented herein. In particular, the top two plots show the operation of the frequency generation circuit 100 when the amplitude regulating parameters are fixed and the loop gain of the first feedback path 130 is high. The bottom plot shows the results when the second feedback path 140 is used to modify the bias current and the $g_m$ cells of the oscillator core when the loop gain of the first feedback path 130 is low. The solution presented herein therefore provides a frequency generation circuit having the amplitude control benefits associated with high gain negative feedback and the power and noise benefits associated with low gain negative feedback.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A frequency generation circuit comprising:
   an oscillator comprising an oscillator output, a first control input, and a second control input;
   a detector configured to detect an amplitude of the oscillator output;
   a first feedback path operatively connecting the detector to the first control input, the first feedback path configured to provide time-continuous control, responsive to the detected amplitude, of the amplitude of the oscillator output by continuously controlling a first control signal applied to the first control input; and
   a second feedback path independent from the first feedback path and operatively connecting the detector to the second control input, the second feedback path configured to provide time-discrete control, responsive to the detected amplitude, of one or more amplitude regulating parameters of the oscillator by providing time-discrete control of a second control signal applied to the second control input,
   wherein the second feedback path prevents changes to the one or more amplitude regulating parameters when the oscillator is being used for wireless communications or when the oscillator has established frequency synchronization with one or more external devices.

2. The frequency generation circuit of claim 1 wherein the first feedback path is configured to continuously control the oscillator amplitude of the oscillator output by continuously controlling a gain of the oscillator responsive to the detected amplitude.

3. The frequency generation circuit of claim 1 wherein the second feedback path comprises a control circuit operatively connected between a detector output and the second control input, and wherein the control circuit is configured to provide the time-discrete control of the one or more amplitude regulating parameters by controlling the one or more amplitude regulating parameters when the detector output satisfies one or more predetermined conditions.

4. The frequency generation circuit of claim 3 wherein the control circuit comprises a first comparison circuit configured to compare the detected amplitude to an upper threshold, and wherein the control circuit is configured to provide the time-discrete control of the one or more amplitude regulating parameters by controlling the one or more amplitude regulating parameters when the detected amplitude exceeds the upper threshold.

5. The frequency generation circuit of claim 3 wherein the control circuit comprises a second comparison circuit configured to compare the detected amplitude to a lower threshold, and wherein the control circuit is configured to provide the time-discrete control the one or more amplitude regulating parameters by controlling the one or more amplitude regulating parameters when the detected amplitude is less than the lower threshold.

6. The frequency generation circuit of claim 3, wherein the one or more amplitude regulating parameters comprise at least one of an oscillator bias current, a number of oscillator $g_m$ cells, a bias point of one or more of the oscillator $g_m$ cells, and a variable resistor connected in parallel with a core of the oscillator.

7. The frequency generation circuit of claim 1 wherein the second feedback path further provides time-discrete control of the one or more amplitude regulating parameters by controlling the one or more amplitude regulating parameters responsive to an event trigger.

8. The frequency generation circuit of claim 7 wherein the event trigger comprises at least one of a power event trigger indicating a powering on of the oscillator and a communication event trigger indicating an upcoming radio communication.

9. The frequency generation circuit of claim 8 wherein the communication event comprises an upcoming random access channel transmission event, an upcoming radio transmission event, or an upcoming radio reception event.

10. The frequency generation circuit of claim 1 further comprising a memory configured to store a current configuration of the oscillator, wherein the current configuration identifies a current status of the one or more amplitude regulating parameters.

11. A method of controlling an oscillator comprising an oscillator output, a first control input, and a second control input, the method comprising:
   detecting an amplitude of the oscillator output;
   providing time-continuous control, responsive to the detected amplitude, of the amplitude of the oscillator output by continuously controlling a first control signal applied to the first control input;
   providing time-discrete control, independent from the time-continuous control and responsive to the detected amplitude, of one or more amplitude regulating parameters of the oscillator by providing time-discrete control of a second control signal applied to the second control input; and
   controlling the second control signal applied to the second control input to prevent changes to the one or more amplitude regulating parameters when the oscillator is being used for wireless communications or when the oscillator has established frequency synchronization with one or more external devices.

12. The method of claim 11 wherein continuously controlling the oscillator amplitude of the oscillator output signal comprises continuously controlling a gain of the oscillator responsive to the detected amplitude.

13. The method of claim 11 wherein providing the time-discrete control of the one or more amplitude regulating parameters comprises controlling the one or more amplitude regulating parameters when a detector output satisfies one or more predetermined conditions.

14. The method of claim 13 further comprising comparing the detected amplitude to an upper threshold, wherein providing the time-discrete control of the one or more amplitude regulating parameters comprises controlling the one or more amplitude regulating parameters when the detected amplitude exceeds the upper threshold.

15. The method of claim 13 further comprising comparing the detected amplitude to a lower threshold, wherein providing the time-discrete control of the one or more amplitude regulating parameters comprises controlling the one or more amplitude regulating parameters when the detected amplitude is less than the lower threshold.

16. The method of claim 13 wherein the one or more amplitude regulating parameters comprise at least one of an oscillator bias current, a number of oscillator gm cells, a bias point of one or more of the oscillator gm cells, and a variable resistor connected in parallel with a core of the oscillator.

17. The method of claim 11 further comprising providing the time-discrete control of the one or more amplitude regulating parameters by controlling the one or more amplitude regulating parameters responsive to an event trigger.

18. The method of claim 17 wherein the event trigger comprises at least one of a power event trigger indicating a powering on of the oscillator and a communication event indicating an upcoming radio communication.

19. The method of claim 18 wherein the communication event comprises an upcoming random access channel transmission event, an upcoming radio transmission event, or an upcoming radio reception event.

20. The method of claim 11 further comprising storing a current configuration of the oscillator in memory, wherein the current configuration identifies a current status of the one or more amplitude regulating parameters.

21. A computer program product stored in a non-transitory computer readable medium for controlling an oscillator of a frequency generation circuit, the oscillator comprising an oscillator output, a first control input, and a second control input, the computer program product comprising software instructions which, when run on the frequency generation circuit, causes the frequency generation circuit to:
   detect an amplitude of the oscillator output;
   provide time-continuous control, responsive to the detected amplitude, of the amplitude of the oscillator output by continuously controlling a first control signal applied to the first control input;
   provide time-discrete control, independent from the time-continuous control and responsive to the detected amplitude, of one or more amplitude regulating parameters of the oscillator by providing time-discrete control of a second control signal applied to the second control input; and
   control the second control signal applied to the second control input to prevent changes to the one or more amplitude regulating parameters when the oscillator is being used for wireless communications or when the oscillator has established frequency synchronization with one or more external devices.

* * * * *